(12) United States Patent
Chen et al.

(10) Patent No.: US 10,840,937 B1
(45) Date of Patent: Nov. 17, 2020

(54) SERVER WITH CAPABILITY OF DUPLICATING VIDEO SOURCE SIGNAL

(71) Applicant: MITAC COMPUTING TECHNOLOGY CORPORATION, Taoyuan (TW)

(72) Inventors: Sheng-Chang Chen, Taoyuan (TW); Sung-Xuan Huang, Taoyuan (TW); Sheng-Shih Tsai, Taoyuan (TW)

(73) Assignee: Mitac Computing Technology Corporation, Taoyuan (TW)

( * ) Notice: Subject to any disclaimer, the term of this patent is extended or adjusted under 35 U.S.C. 154(b) by 0 days.

(21) Appl. No.: 16/860,951

(22) Filed: Apr. 28, 2020

(30) Foreign Application Priority Data

Jul. 3, 2019 (TW) .............................. 108123377 A

(51) Int. Cl.
*H03M 1/36* (2006.01)
*H03M 1/20* (2006.01)
*G06F 13/38* (2006.01)

(52) U.S. Cl.
CPC ............ *H03M 1/36* (2013.01); *G06F 13/385* (2013.01); *H03M 1/205* (2013.01)

(58) Field of Classification Search
CPC ........ H03M 1/36; H03M 1/205; G06F 13/385
USPC .................................. 341/110, 144, 155, 159
See application file for complete search history.

(56) References Cited

U.S. PATENT DOCUMENTS

| | | | |
|---|---|---|---|
| 7,209,103 B2 * | 4/2007 | Maeda ...................... | G06F 3/14 345/204 |
| 7,330,199 B2 * | 2/2008 | Someya .................... | G06T 5/20 345/690 |

* cited by examiner

*Primary Examiner* — Khai M Nguyen
(74) *Attorney, Agent, or Firm* — Michael Best & Friedrich LLP

(57) ABSTRACT

A server utilizes a BMC to divide a video source signal into original analog and digital component signals, and stores the digital component signal in a set of registers of a duplicator. An ADC converts the original analog component signal into a converted digital component signal, which is stored in another set of registers of the duplicator. A switch set of the duplicator is switched to output a pair of the converted and the original digital component signals. One DAC converts the converted digital component signal into a converted analog component signal, which together with the original digital component signal, serves as a duplicated video signal.

20 Claims, 3 Drawing Sheets

SERVER WITH CAPABILITY OF DUPLICATING VIDEO SOURCE SIGNAL

CROSS-REFERENCE TO RELATED APPLICATION

This application claims priority of Taiwanese Invention Patent Application No. 108123377, filed on Jul. 3, 2019.

FIELD

The disclosure relates to a server, and more particularly to a server with a capability of duplicating a video source signal to obtain a plurality of duplicated video signals to be outputted to a plurality of display devices.

BACKGROUND

When maintaining a server, displaying maintenance-related information of the server simultaneously on multiple display devices facilitates troubleshooting tasks performed by frontend and backend maintenance staffs. Conventionally, a dynamic switching approach is adopted to accomplish simultaneous displaying of the maintenance-related information on multiple display devices, and is realized by mounting a detection chip on the server. The detection chip is capable of detecting the presence of a signal of a format supported by the display devices, and is capable of enabling the server to determine, based on a detection result of impedance variation(s) on specific pin(s) of the server, whether any of the display devices is connected to the server. When the server determines that one or more display devices are connected thereto, signals containing the maintenance-related information are relayed to the connected display device(s) for displaying thereon. In another approach, a switch chip is mounted on the server, and an external control circuit is connected to the server and is used to select one or more terminals of the server for video output purposes. The switch chip is capable of processing analog signals. The switch chip and the external control circuit cooperatively control transmission of signals containing the maintenance-related information only to those of the display devices that are connected to the server via the terminal(s) selected for video output purposes, so as to display the signals on such display device(s).

However, implementation of the above-mentioned approaches requires additional hardware, which come with increased expenses. Moreover, limited available space of the server may be a challenge to installing additional hardware.

SUMMARY

Therefore, an object of the disclosure is to provide a server with a capability of duplicating a video source signal to obtain a plurality of duplicated video signals to be outputted to a plurality of display devices that can alleviate at least one of the drawbacks of the prior art.

According to the disclosure, the server includes a baseboard management controller (BMC) and a duplicator.

The BMC is configured to receive the video source signal, and to divide the video source signal into an original analog component signal and an original digital component signal.

The duplicator is electrically connected to the BMC, and includes an analog-to-digital converter (ADC), a plurality of first registers, a plurality of second registers, a switch set and a plurality of digital-to-analog converters (DACs).

The ADC is configured to convert the original analog component signal into a converted digital component signal, and to output the converted digital component signal.

The first registers are electrically connected to the ADC, and respectively correspond to the display devices. Each of the first registers is configured to receive the converted digital component signal and to store the converted digital component signal.

The second registers respectively correspond to the display devices. Each of the second registers is configured to receive the original digital component signal and to store the original digital component signal.

The switch set is electrically connected to the first registers and the second registers. The switch set is configured to, for each of the display devices, be triggered by a trigger signal to switch from a non-conductive state to a conductive state to output the converted digital component signal that is stored in one of the first registers corresponding to the display device and to output the original digital component signal that is stored in one of the second registers corresponding to the display device.

The DACs are electrically connected to the switch set, and respectively correspond to the display devices. Each of the DACs is configured to convert the converted digital component signal outputted by the switch set for the display device into a converted analog component signal.

For each of the display devices, the converted analog component signal and the original digital component signal cooperatively serve as one of the duplicated video signals to be outputted to the display device for display thereon.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
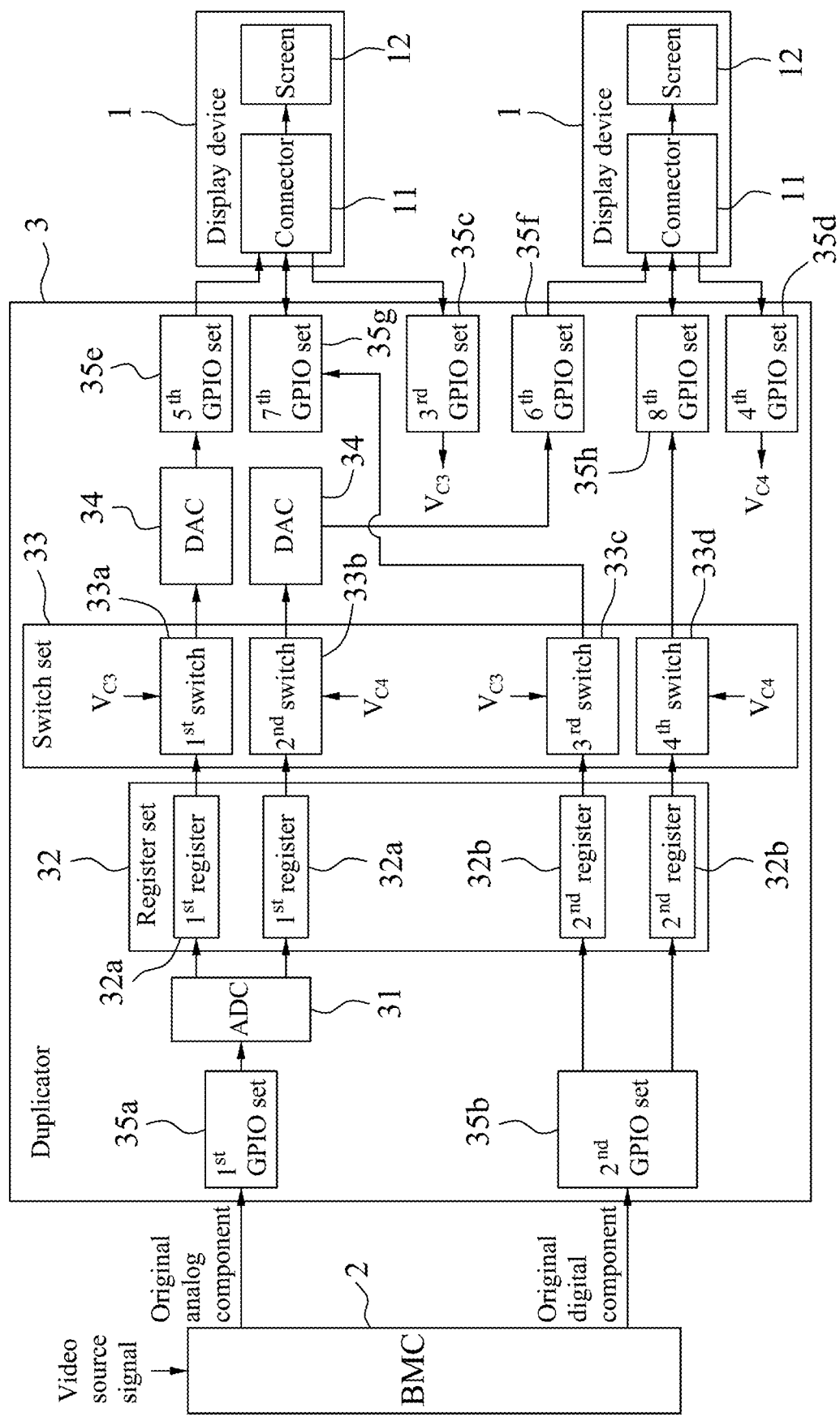
FIG. 1 is a block diagram illustrating an embodiment of a server according to the disclosure.
Figure 2:
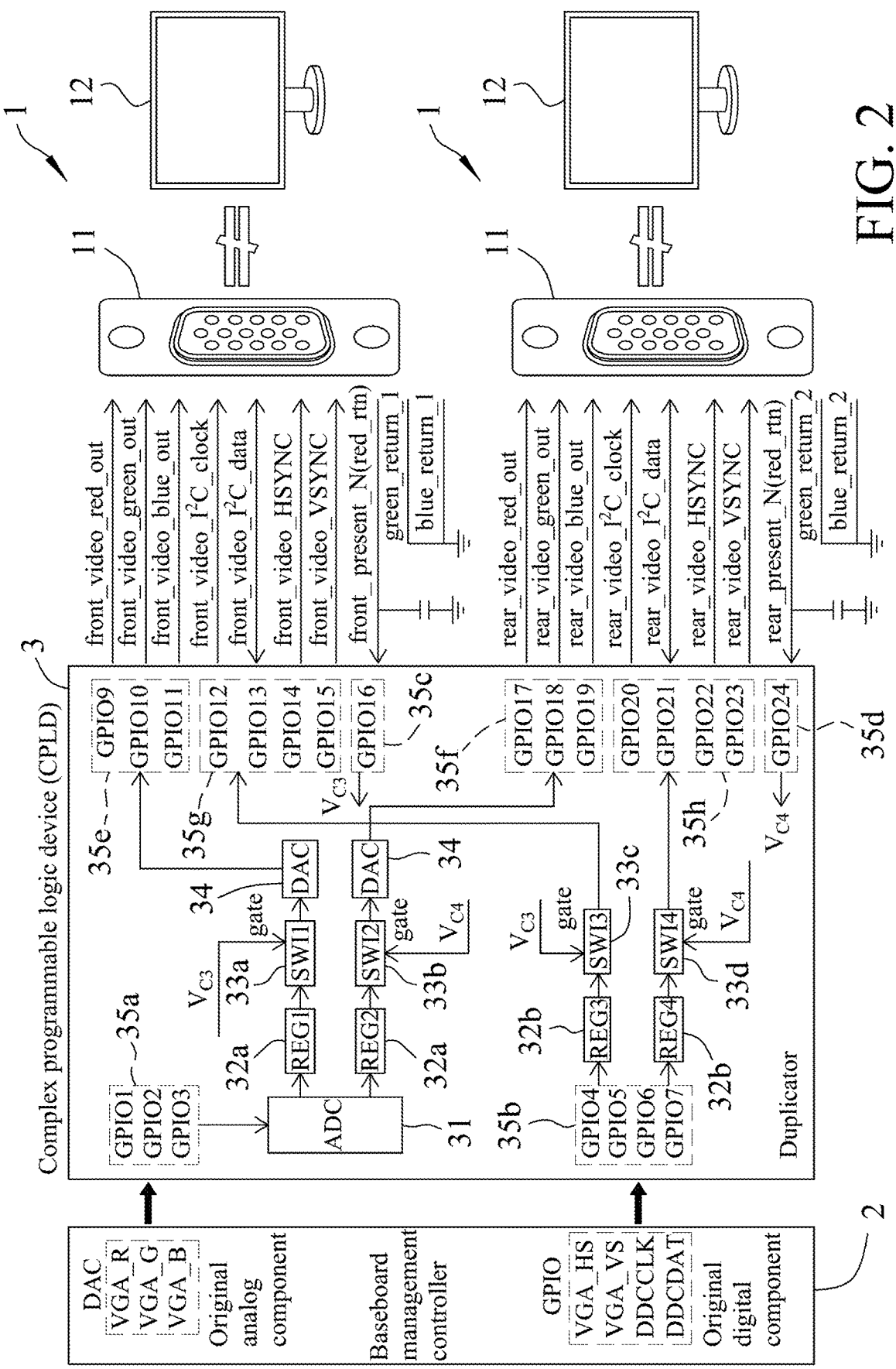
FIG. 2 is a schematic circuit diagram illustrating an embodiment of the server according to the disclosure.

Referring to FIGS. 1 and 2, an embodiment of a server according to the disclosure is illustrated. The server is adapted for duplicating a video source signal to obtain a plurality of duplicated video signals to be outputted to a plurality of display devices 1. The display devices 1 are N in number, where N is an integer not smaller than two. In this embodiment, the display devices 1 are two in number as shown in FIGS. 1 and 2.

The server includes a baseboard management controller (BMC) 2, and a duplicator 3 that is electrically connected to the BMC 2.

Each of the display devices 1 includes a connector 11 and a screen 12. Each of the display devices 1 is adapted to be electrically connected to the duplicator 3 via the connector 11 for establishing communication with the duplicator 3. Each of the display devices 1 generates a trigger signal when the display device 1 is electrically connected to the duplicator 3, and is configured to display video contents on the screen 12 based on one of the duplicated video signals received from the duplicator 3.

The BMC 2 is configured to receive the video source signal. In this embodiment, the video source signal is a video signal conforming to video graphic array (VGA) standards (hereinafter the video source signal is also referred to as a VGA video signal), and the duplicated video signals are identical to the video source signal. The BMC 2 is configured to divide the video source signal into an original analog component signal and an original digital component signal. The original analog component signal contains color information of red, green and blue, i.e., streams of data "VGA_R", "VGA_G" and "VGA_B" outputted from the BMC 2 as shown in FIG. 2. The original digital component signal contains information for horizontal synchronization, information for vertical synchronization, clock information for display data channel (DDC), and data for DDC, i.e., streams of data "VGA_HS", "VGA_VS", "DDCCLK" and "DDCDAT" outputted from the BMC 2 as shown in FIG. 2.

The duplicator 3 includes an analog-to-digital converter (ADC) 31, a register set 32, a switch set 33, a plurality of digital-to-analog converters (DACs) 34, a first general-purpose input/output (GPIO) set 35a, a second GPIO set 35b, a third GPIO set 35c, a fourth GPIO set 35d, a fifth GPIO set 35e, a sixth GPIO set 35f, a seventh GPIO set 35g and an eighth GPIO set 35h. Since the display devices 1 are two in number in this embodiment, the DACs 34 are also two in number. The third GPIO set 35c, the fifth GPIO set 35e and the seventh GPIO set 35g constitute an output port for one of the display devices 1, and the fourth GPIO set 35d, the sixth GPIO set 35f and the eighth GPIO set 35h constitute another output port for the other one of the display devices 1.

It should be noted that in this embodiment, the duplicator 3 is one of a complex programmable logic device (CPLD) and a field programmable gate array (FPGA). The ADC 31, the register set 32, the switch set 33, the DACs 34, and the first to the eighth GPIO sets 35a to 35h are electronic circuits implemented by using a hardware description language (HDL). In this embodiment, Verilog is used as the HDL to configure the CPLD or the FPGA to simulate the ADC 31, the register set 32, the switch set 33, the DACs 34, and the first to the eighth GPIO sets 35a to 35h. Since most servers are equipped with the CPLD or the FPGA, no additional hardware (e.g., a detection chip, or a switch chip and an external control circuit as conventionally utilized) is required to implement functions of duplicating a video source signal (e.g., the VGA video signal) for display on multiple display devices.

The first GPIO set 35a is electrically connected between the BMC 2 and the ADC 31, and includes GPIO pins "GPIO1", "GPIO2" and "GPIO3" as shown in FIG. 2. The first GPIO set 35a is configured to transfer the original analog component signal obtained from the BMC 2 to the ADC 31.

The ADC 31 is configured to convert the original analog component signal into a converted digital component signal, and to output the converted digital component signal.

Figure 3:
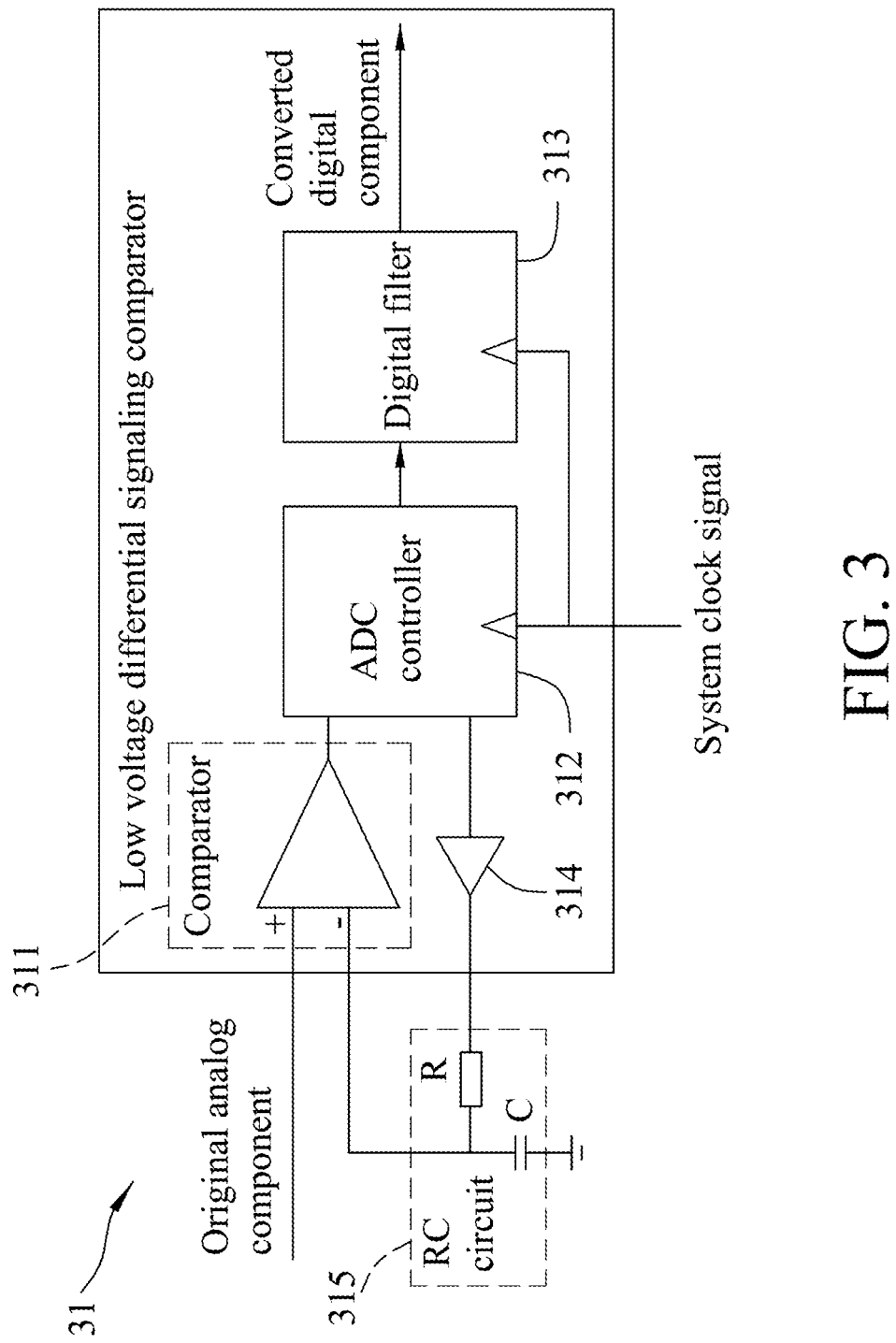
FIG. 3 is a schematic circuit diagram illustrating an embodiment of an analog-to-digital converter (ADC) of the server according to the disclosure.

Specifically speaking, referring to FIG. 3, the ADC 31 includes a comparator 311, an ADC controller 312, a digital filter 313, an inverter 314 and an RC circuit 315. The comparator 311 is electrically connected to the BMC 2 (see FIG. 1, via the first GPIO set 35a). The ADC controller 312 is electrically connected to the comparator 311. The digital filter 313 is electrically connected to the ADC controller 312.

The comparator 311 is configured to receive the original analog component signal from the BMC 2 via a non-inverting input terminal (+) of the comparator 311 which is connected to the first GPIO set 35a, to receive, via an inverting input terminal (−) of the comparator 311, a fraction of a comparison voltage signal generated by the ADC controller 312, and to generate a comparison result signal at an output terminal of the comparator 311 based on a voltage difference between the original analog component signal and the fraction of the comparison voltage signal. It is worth to note that in this embodiment, the comparator 311 is a low voltage differential signaling (LVDS) comparator. The comparator 311 outputs a Boolean signal representing logic "1" to the ADC controller 312 when a voltage of the original analog component signal is higher than the fraction of the comparison voltage signal. Otherwise, i.e., when the voltage of the original analog component signal is not higher than the fraction of the comparison voltage signal, the comparator 311 outputs a Boolean signal representing logic "0". By varying the comparison voltage signal generated by the ADC controller 312, the voltage value of the original analog component signal can be precisely converted into a digital representation (i.e., the comparison result signal), which is to be transferred via the ADC controller 312 to the digital filter 313 for further processing (e.g., noise reduction).

The ADC controller 312 is configured to generate the comparison voltage signal, and to output the comparison voltage signal to the comparator 311 via the inverter 314 and the RC network 315, where the RC network 315 includes a resistor (R) and a capacitor (C) as shown in FIG. 3. The inverting input terminal (−) of the comparator 311 is electrically connected to a node between the capacitor (C) and the resistor (R) to receive the fraction of the comparison voltage signal.

The digital filter 313 is configured to receive the comparison result signal via the ADC controller 312, and to output the converted digital component signal based on the comparison result signal.

The register set 32 includes a plurality of first registers 32a and a plurality of second registers 32b. Since the display devices 1 are two in number in this embodiment, the first registers 32a are two in number, and the second registers 32b are also two in number.

The first registers 32a are electrically connected to the digital filter 313 (see FIG. 3) of the ADC 31, and respectively correspond to the display devices 1. Each of the first registers 32a is configured to receive the converted digital component signal and to store the converted digital component signal. In other words, two identical converted digital component signals are respectively stored in the first registers 32a.

Similarly, the second registers 32b respectively correspond to the display devices 1. The second GPIO set 35b is electrically connected between the BMC 2 and the second registers 32b, and includes GPIO pins "GPIO4", "GPIO5", "GPIO6" and "GPIO7" as shown in FIG. 2. The second GPIO set 35b is configured to transfer the original digital component signal obtained from the BMC 2 to each of the second registers 32b. Each of the second registers 32b is configured to receive the original digital component signal via the second GPIO set 35b, and to store the original digital component signal. That is, two identical original digital component signals are respectively stored in the second registers 32b.

The switch set 33 is electrically connected to the first registers 32a and the second registers 32b. The switch set 33 is configured to, with respect to each of the display devices 1, be triggered by the trigger signal, which is generated by the display device 1, to switch from a non-conductive state to a conductive state in order to output the converted digital component signal that is stored in one of the first registers 32a corresponding to the display device 1 and to output the original digital component signal that is stored in one of the second registers 32b corresponding to the display device 1. It should be noted that when the switch set 33 is in the non-conductive state, the switch set 33 refrains from outputting any of the converted digital component signals and the original digital component signals.

Specifically speaking, the switch set 33 includes a first switch 33a and a second switch 33b. The first and second switches 33a, 33b are electrically and respectively connected to the first registers 32a for respectively receiving the converted digital component signals stored in the first registers 32a, and are electrically and respectively connected to the DACs 34. When triggered by the trigger signal to switch to conduction, the first switch 33a allows passage of the converted digital component signal therethrough to one of the DACs 34 corresponding to the first switch 33a; likewise, when triggered by the trigger signal to switch to conduction, the second switch 33b allows passage of the converted digital component signal therethrough to one of the DACs 34 corresponding to the second switch 33b.

In addition, the switch set 33 further includes a third switch 33c and a fourth switch 33d. The third and fourth switches 33c, 33d are electrically and respectively connected to the second registers 32b for respectively receiving the original digital component signals stored in the second registers 32b, and are to be electrically and respectively connected to the display devices 1. When triggered by the trigger signal to switch to conduction, the third switch 33c allows passage of the original digital component signal therethrough to one of the display devices 1 corresponding to the third switch 33c; likewise, when triggered by the trigger signal to switch to conduction, the fourth switch 33d allows passage of the original digital component signal therethrough to one of the display devices 1 corresponding to the fourth switch 33d.

It should be noted that when one of the display devices 1 is electrically connected to the duplicator 3 and outputs the trigger signal to the duplicator 3, one pair of switches (e.g., the pair of the first switch 33a and the third switch 33c, or the pair of the second switch 33b and the fourth switch 33d) that are respectively connected to the corresponding one of the first registers 32a and the corresponding one of the second registers 32b will be triggered by the trigger signal to switch to conduction. Herein, when any one of the switches in the switch set 33 is switched to conduction, the switch set 33 is deemed to be in the conductive state.

Referring to FIGS. 1 and 2 for further explanation, one of the display devices 1, when connected to the duplicator 3, outputs signal component signals "front_present_N(red_rtn)", "green_return_1" and "blue_return_1". The signal component signal "front_present_N(red_rtn)" is utilized as the trigger signal ($V_{C3}$) to be transmitted to the duplicator 3 via a GPIO pin "GPIO16" of the duplicator 3. The third GPIO set 35c, which includes the GPOIO pin "GPIO16", is electrically connected between the one of the display devices 1 and the switch set 33, and is configured to transfer the trigger signal ($V_{C3}$) obtained from the one of the display devices 1 to both the first and third switches 33a, 33c of the switch set 33. Therefore, the first and third switches 33a, 33c respectively connected to one of the first registers 32a and one of the second registers 32b that correspond to said one of the display devices 1 would be triggered by the trigger signal ($V_{C3}$) to switch to conduction when the one of the display devices 1 is connected to the duplicator 3.

Likewise, another one of the display devices 1, when connected to the duplicator 3, outputs signal component signals "rear_present_N(red_rtn)", "green_return2" and "blue_return2". The signal component signal "rear_present-_N(red_rtn)" is utilized as the trigger signal ($V_{C4}$) to be transmitted to the duplicator 3 via a GPIO pin "GPIO24" of the duplicator 3. The fourth GPIO set 35d, which includes the GPOIO pin "GPIO24", is electrically connected between said another one of the display devices 1 and the switch set 33, and is configured to transfer the trigger signal ($V_{C4}$) obtained from said another one of the display devices 1 to both the second and fourth switches 33b, 33d of the switch set 33. Therefore, the second and fourth switches 33b, 33d respectively connected to another of the first registers 32a and another of the second registers 32b that correspond to said another one of the display devices 1 would be triggered by the trigger signal ($V_{C4}$) to switch to conduction when said another one of the display devices 1 is connected to the duplicator 3.

The DACs 34 are electrically connected to the switch set 33, and respectively correspond to the display devices 1. Each of the DACs 34 is configured to convert the converted digital component signal, which is outputted by a respective one of the first and second switches 33a, 33b of the switch set 33 and which is outputted for the respective one of the display devices 1, into a converted analog component signal. The converted analog component signals respectively generated by the DACs 34 will be outputted to the respective display devices 1 respectively via the fifth GPIO set 35e (which includes GPIO pins "GPIO9", "GPIO10" and "GPIO11" as shown in FIG. 2) and the sixth GPIO set 35f (which includes GPIO pins "GPIO17", "GPIO18" and "GPIO19" as shown in FIG. 2).

On the other hand, the original digital component signals respectively passing through the third and fourth switches 33c, 33d will be outputted to the respective display devices 1 respectively via the seventh GPIO set 35g (which includes GPIO pins "GPIO12", "GPIO13", "GPIO14" and "GPIO15" as shown in FIG. 2) and the eighth GPIO set 35h (which includes GPIO pins "GPIO20", "GPIO21", "GPIO22" and "GPIO23" as shown in FIG. 2).

For each of the display devices 1, the corresponding converted analog component signal and the corresponding original digital component signal cooperatively serve as one of the duplicated video signals to be outputted to the display device 1 for display thereon.

Specifically speaking, for the upper one of the display devices 1 (referred to as an upper display) in FIG. 2 that is connected to the duplicator 3 via the third GPIO set 35c, the fifth GPIO set 35e and the seventh GPIO set 35g, the converted analog component signal containing the color information of red, green and blue of the original analog component signal outputted by the BMC 2 is transmitted to the upper display as streams of data "front_video_red_out", "front_video_green_out" and "front_video_blue_out" respectively via the GPIO pins "GPIO9", "GPIO10" and "GPIO11" of the fifth GPIO set 35e. Further, the original digital component signal outputted by the BMC 2 and containing the information for horizontal synchronization, the information for vertical synchronization, the clock information for DDC and the data for DDC is transmitted to the upper display as streams of data "front_video_HSYNC", "front_video_VSYNC", "front_video_I²C_clock" and "front_video_I²C_data" respectively via the GPIO pins "GPIO14", "GPIO15", "GPIO12" and "GPIO13" of the seventh GPIO set 35g.

Likewise, for the lower one of the display devices 1 (referred to as a lower display) in FIG. 2 that is connected to the duplicator 3 via the fourth GPIO set 35d, the sixth GPIO set 35f and the eighth GPIO set 35h, the converted analog component signal containing the color information of red, green and blue of the original analog component signal outputted by the BMC 2 is transmitted to the lower display as streams of data "rear_video_red_out", "rear_video_green_out" and "rear_video_blue_out" respectively via the GPIO pins "GPIO17", "GPIO18" and "GPIO19" of the sixth GPIO set 35f. Further, the original digital component signal outputted by the BMC 2 and containing the information for horizontal synchronization, the information for vertical synchronization, the clock information for DDC and the data for DDC is transmitted to the lower display as streams of data "rear_video_HSYNC", "rear_video_VSYNC", "rear_video_I²C_clock" and "rear_video_I²C_data" respectively via the GPIO pins "GPIO22", "GPIO23", "GPIO20" and "GPIO21" of the eighth GPIO set 35h. It is noted that even though naming for the streams of data outputted to the upper display is different from that for the steams of data outputted to the lower display, contents of the converted analog component signal and the original digital component signal transmitted to the upper display should be identical to those of the converted analog component signal and the original digital component signal transmitted to the lower display.

In summary, the server according to the disclosure utilizes the BMC 2 to divide the video source signal into the original analog component signal and the original digital component signal at first. The server then utilizes the ADC 31 to convert the original analog component signal into the converted digital component signal, utilizes the first registers 32a to store the converted digital component signals, utilizes the second registers 32b to store the original digital component signals, utilizes the switch set 33 to control passage of individual converted digital component signals and individual original digital component signals therethrough based on the trigger signals transmitted by the corresponding display devices 1 when the same are individually connected to the server, and utilizes the DACs 34 to convert the converted digital component signals into the converted analog component signals. Corresponding pairs of the converted analog component signals and the original digital component signals serve as the duplicated video signals to be displayed on the display devices 1 connected to the server.

Implementing the duplicator 3 with the built-in FPGA or CPLD of the server by using HDL is beneficial in the aspects of increasing usage rate of existing hardware resources, saving on additional hardware component signals to be mounted to the server, and reducing hardware cost. In addition, high flexibility in circuit design provided by the FPGA or the CPLD makes it easier to arrange input/output ports for signals on the FPGA or the CPLD, and can help optimize the entire circuit layout on the printed circuit board of the server. Moreover, VGA connectors are disposed at front and back sides of most servers nowadays, and such hardware design is convenient for on-site maintenance staffs to maintain the server according to the disclosure inside a server room.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A server with a capability of duplicating a video source signal to obtain a plurality of duplicated video signals to be outputted to a plurality of display devices, said server comprising:
    a baseboard management controller (BMC) configured to receive the video source signal, and to divide the video source signal into an original analog component signal and an original digital component signal; and
    a duplicator electrically connected to said BMC, and including
        an analog-to-digital converter (ADC) which is configured to convert the original analog component signal into a converted digital component signal, and to output the converted digital component signal,
        a plurality of first registers which are electrically connected to said ADC, which respectively correspond to the display devices, and each of which is configured to receive the converted digital component signal and to store the converted digital component signal,
        a plurality of second registers which respectively correspond to the display devices, and each of which is configured to receive the original digital component signal and to store the original digital component signal,
        a switch set which is electrically connected to said first registers and said second registers, which is configured to, for each of the display devices, be triggered by a trigger signal to switch from a non-conductive state to a conductive state to output the converted digital component signal that is stored in one of said first registers corresponding to the display device and to output the original digital component signal that is stored in one of said second registers corresponding to the display device, and
        a plurality of digital-to-analog converters (DACs) which are electrically connected to said switch set, which respectively correspond to the display devices, and each of which is configured to convert the converted digital component signal outputted by said switch set for a respective one of the display devices into a converted analog component signal,
    wherein, for each of the display devices, the converted analog component signal and the original digital component signal cooperatively serve as one of the duplicated video signals to be outputted to the display device for displaying thereon.

2. The server as claimed in claim 1, wherein said duplicator further includes:
   a first general-purpose input/output (GPIO) set that is electrically connected between said BMC and said ADC, and that is configured to transfer the original analog component signal obtained from said BMC to said ADC; and
   a second GPIO set that is electrically connected between said BMC and said second registers, and that is configured to transfer the original digital component signal obtained from said BMC to each of said second registers.

3. The server as claimed in claim 1, wherein:
   each of the display devices generates the trigger signal when the display device is electrically connected to said duplicator.

4. The server as claimed in claim 3, the display devices being two in number, wherein said duplicator further includes:
   a third GPIO set that is electrically connected between one of the display devices and said switch set, and that is configured to transfer the trigger signal obtained from the one of the display devices to said switch set; and
   a fourth GPIO set that is electrically connected between another one of the display devices and said switch set, and that is configured to transfer the trigger signal obtained from the another one of the display devices to said switch set.

5. The server as claimed in claim 1, wherein said ADC includes:
   a comparator that is electrically connected to said BMC;
   an ADC controller that is electrically connected to said comparator, and that is configured to generate a comparison voltage signal; and
   a digital filter that is electrically connected to said ADC controller,
   wherein said comparator is configured to receive the original analog component signal from said BMC, to receive the comparison voltage signal generated by said ADC controller, and to generate a comparison result signal based on the original analog component signal and the comparison voltage signal, and
   wherein said digital filter is configured to receive the comparison result signal, and to output the converted digital component signal based on the comparison result signal.

6. The server as claimed in claim 5, wherein said comparator is a low voltage differential signaling (LVDS) comparator.

7. The server as claimed in claim 5, wherein said digital filter is configured to perform noise reduction processing on the comparison result signal.

8. The server as claimed in claim 5, wherein said ADC further includes an RC circuit that includes a resistor (R) and a capacitor (C).

9. The server as claimed in claim 1, wherein said switch set includes a plurality of switches that are electrically and respectively connected to said first registers for respectively receiving the converted digital component signals stored in said first registers, and that are electrically and respectively connected to said DACs;
   wherein for each of said switches connected to said first registers, when triggered by the trigger signal to switch to conduction, said switch allows passage of the converted digital component signal therethrough to the respective one of said DACs.

10. The server as claimed in claim 9, wherein said switch set further includes a plurality of switches that are electrically and respectively connected to said second registers for respectively receiving the original digital component signals stored in said second registers, and that are to be electrically and respectively connected to the display devices;
   wherein for each of said switches connected to said second registers, when triggered by the trigger signal to switch to conduction, said switch allows passage of the original digital component signal therethrough to the respective one of the display devices.

11. The server as claimed in claim 9, wherein said duplicator further includes:
   a fifth general-purpose input/output (GPIO) set that is electrically connected between one of said DACs and one of the display devices, and that is configured to transfer the converted analog component signal to said one of the display devices.

12. The server as claimed in claim 11, wherein said duplicator further includes:
   a sixth general-purpose input/output (GPIO) set that is electrically connected between another one of said DACs and another one of the display devices, and that is configured to transfer the converted analog component signal to said another one of the display devices.

13. The server as claimed in claim 9, wherein said duplicator further includes:
   a seventh GPIO set that is electrically connected between one of said switches and one of the display devices, and that is configured to transfer the original digital component signal to said one of the display devices.

14. The server as claimed in claim 13, wherein said duplicator further includes:
   a eighth GPIO set that is electrically connected between another one of said switches and another one of the display devices, and that is configured to transfer the original digital component signal to said another one of the display devices.

15. The server as claimed in claim 1, wherein said ADC, said first registers, said second registers and said switch set are electronic circuits implemented by using a hardware description language (HDL).

16. The server as claimed in claim 1, wherein said duplicator is a complex programmable logic device (CPLD).

17. The server as claimed in claim 1, wherein said duplicator is a field programmable gate array (FPGA).

18. The server as claimed in claim 1, wherein the video source signal is a video signal conforming to video graphic array (VGA) standards.

19. The server as claimed in claim 1, wherein the original analog component signal contains color information of red, green and blue.

20. The server as claimed in claim 1, wherein the original digital component signal contains information for horizontal synchronization, information for vertical synchronization, clock information for display data channel (DDC), and data for DDC.

* * * * *